(12) United States Patent
Noritake et al.

(10) Patent No.: US 7,601,625 B2
(45) Date of Patent: Oct. 13, 2009

(54) METHOD FOR MANUFACTURING SEMICONDUCTOR DEVICE HAVING SOLDER LAYER

(75) Inventors: Chikage Noritake, Ama-gun (JP); Yoshitsugu Sakamoto, Toyohashi (JP); Akira Tanahashi, Okazaki (JP); Hideki Okada, Aichi-gun (JP); Tomomasa Yoshida, Aichi-gun (JP)

(73) Assignees: DENSO CORPORATION, Kariya (JP); Toyota Jidosha Kabushiki Kaisha, Aichi-ken (JP)

( * ) Notice: Subject to any disclaimer, the term of this patent is extended or adjusted under 35 U.S.C. 154(b) by 284 days.

(21) Appl. No.: 11/108,908

(22) Filed: Apr. 19, 2005

(65) Prior Publication Data

US 2005/0233568 A1 Oct. 20, 2005

(30) Foreign Application Priority Data

Apr. 20, 2004 (JP) ............................... 2004-124222

(51) Int. Cl.
*H01L 21/44* (2006.01)
(52) U.S. Cl. ................................ 438/612; 257/E21.51
(58) Field of Classification Search ................ 438/677; 257/E21.51
See application file for complete search history.

(56) References Cited

U.S. PATENT DOCUMENTS 5,877,079 A * 3/1999 Karasawa et al. ............ 438/613

6,596,621 B1 * 7/2003 Copeland et al. ............ 438/614
6,911,388 B2 * 6/2005 Kee et al. .................... 438/613
2003/0022464 A1 * 1/2003 Hirano et al. ................ 438/460
2003/0119281 A1   6/2003 Suzuki et al.

FOREIGN PATENT DOCUMENTS

| DE | 1 295 697 | 3/1969 |
|---|---|---|
| DE | 197 28 014 A1 | 1/1999 |
| JP | A-02-144928 | 6/1990 |
| JP | A-04-312932 | 11/1992 |
| JP | A-05-243289 | 9/1993 |
| JP | A-06-196511 | 7/1994 |
| JP | A-06-333961 | 12/1994 |
| JP | A-07-176547 | 7/1995 |
| JP | A-07-263469 | 10/1995 |

(Continued)

OTHER PUBLICATIONS

Office Action from German Patent Office issued on Aug. 14, 2006 for the corresponding German patent application No. 10 2005 018 108. 2-33 (a copy and English translation thereof).

(Continued)

*Primary Examiner*—Asok K Sarkar
(74) *Attorney, Agent, or Firm*—Posz Law Group, PLC (57) ABSTRACT

A method for manufacturing a semiconductor device having a solder layer includes the steps of: grinding a mounting surface of a semiconductor chip; etching the mounting surface of the chip; forming an electrode on the mounting surface of the chip; assembling the chip, the solder layer and a base in this order; and heating the chip, the solder layer and the base to be equal to or higher than a solidus temperature of the solder layer so that the solder layer is reflowed for soldering the chip on the base.

12 Claims, 8 Drawing Sheets

FOREIGN PATENT DOCUMENTS

| | | |
|---|---|---|
| JP | A-9-277081 | 10/1997 |
| JP | A-11-74298 | 3/1999 |
| JP | A-2001-035978 | 2/2001 |
| JP | A-2002-239780 | 8/2002 |
| JP | A-2004-111607 | 4/2004 |
| JP | A-2004-119944 | 4/2004 |

OTHER PUBLICATIONS

Office Action dated Mar. 13, 2009 in corresponding German patent application No. 102005018108.2 (and English translation).

Notice of Reason for Refusal issued from the Japanese Patent Office on Apr. 28, 2009 in the corresponding Japanese patent application No. 2004-124222 (with English translation).

* cited by examiner

METHOD FOR MANUFACTURING SEMICONDUCTOR DEVICE HAVING SOLDER LAYER

CROSS REFERENCE TO RELATED APPLICATION

This application is based on Japanese Patent Application No. 2004-124222 filed on Apr. 20, 2004, the disclosure of which is incorporated herein by reference.

FIELD OF THE INVENTION

The present invention relates to a method for manufacturing a semiconductor device having a solder layer.

BACKGROUND OF THE INVENTION

A semiconductor device having a semiconductor chip such as an IC chip with an electrode for soldering and a base such as a heat sink and a lead frame is disclosed in Japanese Patent Application Publication No. 2003-110064. In the device, the semiconductor chip is bonded to the base through the electrode by using a solder. The device is manufactured in such a manner that a mounting surface of the semiconductor chip for soldering is grinded and cleaned, and then the electrode is formed on the mounting surface of the chip. After that, the solder is inserted between the semiconductor chip and the base, and the solder is heated up equal to or higher than the solidus temperature of the solder so that the solder is reflowed. Thus, the chip is soldered to the base with the solder so that the chip is electrically, thermally and mechanically bonded to the base.

However, in the device, a solder portion between the chip and the base may include a void. The void causes a contact area of the solder portion to decrease so that electric resistance of the solder portion becomes larger. Thus, heat generation at the solder portion is increased.

Further, the heat generated in the chip is radiated to the outside of the device through the base such as a lead frame. When the void is formed in the solder portion, the heat radiation efficiency of the device is reduced. Furthermore, since the contact area of the solder portion is reduced, the mechanical strength of bonding between the chip and the base is decreased. Thus, the chip may be removed from the base.

Therefore, it is required to reduce the void in the solder portion.

SUMMARY OF THE INVENTION

In view of the above-described problem, it is an object of the present invention to provide a method for manufacturing a semiconductor device having a solder layer. The solder layer has a small amount of voids therein.

A method for manufacturing a semiconductor device having a solder layer, the method includes the steps of: grinding a mounting surface of a semiconductor chip; etching the mounting surface of the chip; forming an electrode on the mounting surface of the chip; assembling the chip, the solder layer and a base in this order; and heating the chip, the solder layer and the base to be equal to or higher than a solidus temperature of the solder layer so that the solder layer is reflowed for soldering the chip on the base.

The above method provides the semiconductor device having the solder layer with a small amount of voids therein. Specifically, the method can reduce an absorbed material as a void generation source on the mounting surface of the chip. This is because the mounting surface becomes smooth after the steps of grinding and etching. Therefore, the absorbed material is prevented from absorbing on the mounting surface. Thus, the void generation source on the mounting surface is reduced so that the voids in the solder layer are reduced.

Further, a method for manufacturing a semiconductor device having a solder layer, the method includes the steps of: roughening a mounting surface of a semiconductor chip; forming an electrode on the mounting surface of the chip; assembling the chip, the solder layer and a base in this order; and heating the chip, the solder layer and the base to be equal to or higher than a solidus temperature of the solder layer so that the solder layer is reflowed for soldering the chip on the base.

The above method provides the semiconductor device having the solder layer with a small amount of voids therein. Specifically, the method can reduce the generation of the gas derived from the absorbed material on the mounting surface. Since the gas is easily generated from the absorbed material when the temperature exceeds over 300° C. Therefore, in the above method, the maximum reflow temperature in the step of heating is set to be equal to or lower than 300° C. Thus, the voids in the solder layer are reduced.

Further, a method for manufacturing a semiconductor device having a solder layer, the method includes the steps of: roughening a mounting surface of a semiconductor chip; forming an electrode on the mounting surface of the chip; assembling the chip, a solder layer and a base in this order; and heating the chip, the solder layer and the base to be equal to or higher than a solidus temperature of the solder layer so that the solder layer is reflowed for soldering the chip on the base. The electrode remains on the mounting surface after the step of heating.

The above method provides the semiconductor device having the solder layer with a small amount of voids therein. Specifically, the method can prevent the gas from penetrating into the solder layer through the electrode. Since the electrode is disposed on the mounting surface even after the step of heating. Thus, even when the gas is generated from the absorbed material, the gas is prevented from penetrating through the electrode. Thus, the voids in the solder layer are reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 6A:
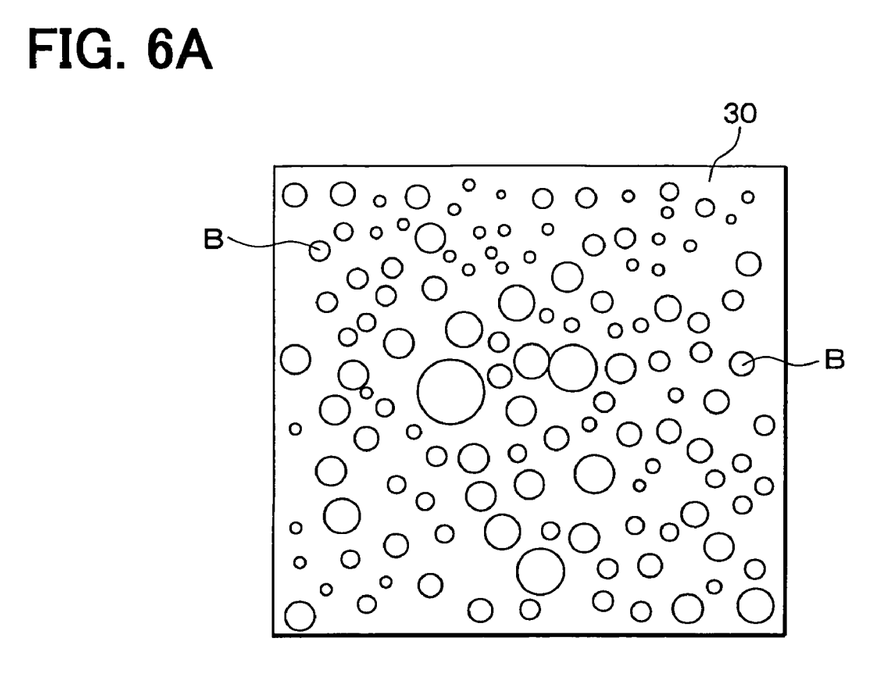
FIG. 6A is an image of X-ray transmission spectroscopy showing a solder layer in the device according to the first comparison of the first embodiment.
Figure 6B:
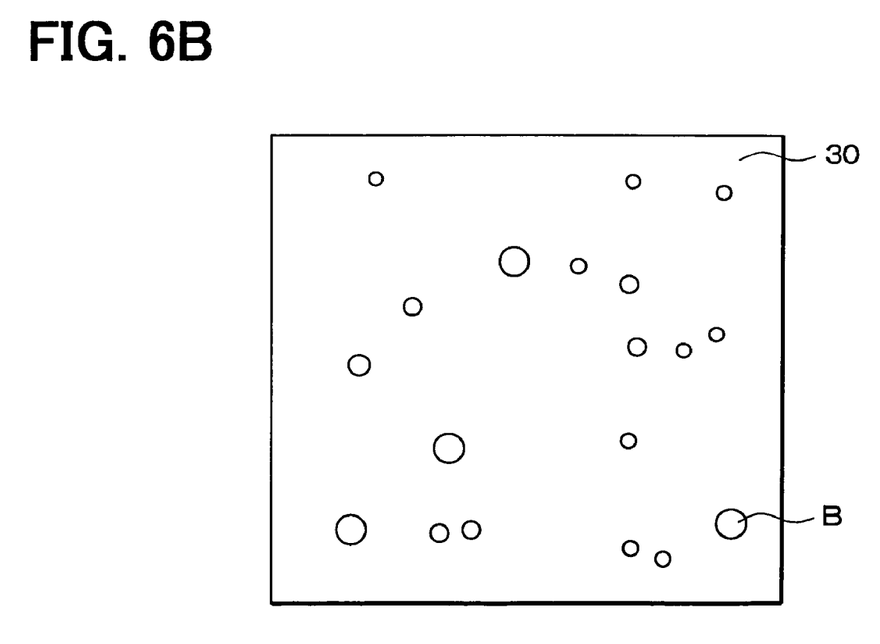
FIG. 6B is an image of X-ray transmission spectroscopy showing a solder layer in the device according to a second comparison of the first embodiment.

The inventors have preliminarily studied about voids in a solder. Specifically, recent years, it is required to remove lead (i.e., Pb) from solder because of environmental protection. Thus, Pb free solder is required to use a semiconductor device. When the Pb free solder is used, the amount of the voids in the Pb free solder becomes higher than that in a conventional Pb solder. FIG. 6A is an X-ray transmission image showing voids in the Pb free solder, and FIG. 6B shows voids in the Pb solder. Here, the Pb solder is made of 10% of tin (i.e., Sn) and 90% of lead (i.e., Pb). In FIGS. 6A and 6B, the voids B is formed in the solder 30.

In a conventional method, a mounting surface, i.e., a soldering surface of a semiconductor chip is grinded and cleaned. Then, electrodes are formed on the mounting surface of the chip. After that, the chip is soldered on a base through the electrodes with solder. Here, the inventors have further studied about the generation source of the voids in the solder as follows.

When the mounting surface of the chip is grinded and cleaned, moisture and/or a component of a grinder is absorbed to the mounting surface. These absorbed materials are vaporized by heat during solder reflow process so that gas is generated between the mounting surface of the chip and the electrodes. The gas diffuses into the solder through the electrodes so that the gas forms the voids.

Specifically, when the solder has no lead, i.e., when the Pb free solder is used, the amount of the void becomes higher, compared with the Pb solder. This is because of the difference of the amount of the tin in solder. The tin forms an alloy with nickel in the electrode of the chip. If the amount of tin is larger, the amount of Ni disappeared in solder during solder reflow process is also larger. Therefore, the gas generated on the mounting surface of the chip is easily diffused into the solder. Here, the gas is generated a lot when the solder is heated higher than 300° C.

In view of the above study, reduction of the absorbed material on the mounting surface, decrease of a reflow temperature of the solder reflow process for limiting the generation of the gas, and/or a prevention of diffusion of the gas through the electrode are studied.

First Embodiment

Figure 1A:
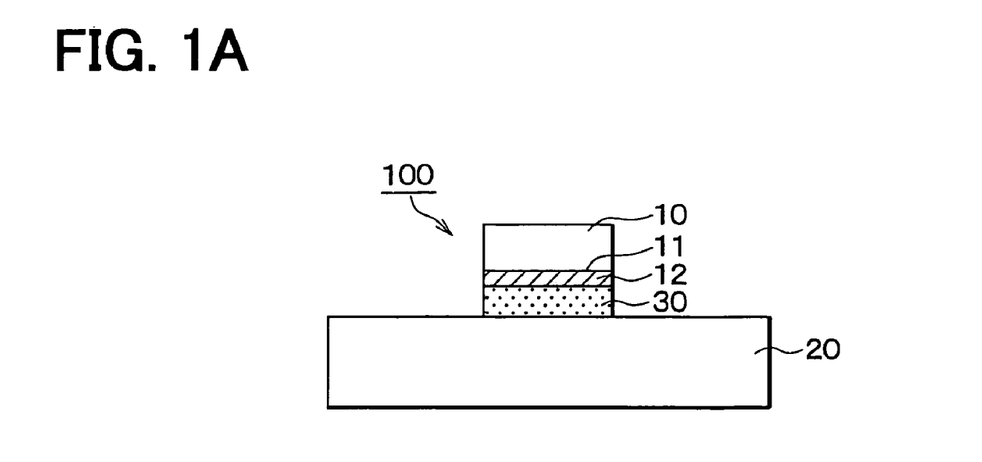
FIG. 1A is a cross sectional view showing a semiconductor device manufactured by a method according to a first embodiment of the present invention.
Figure 1B:
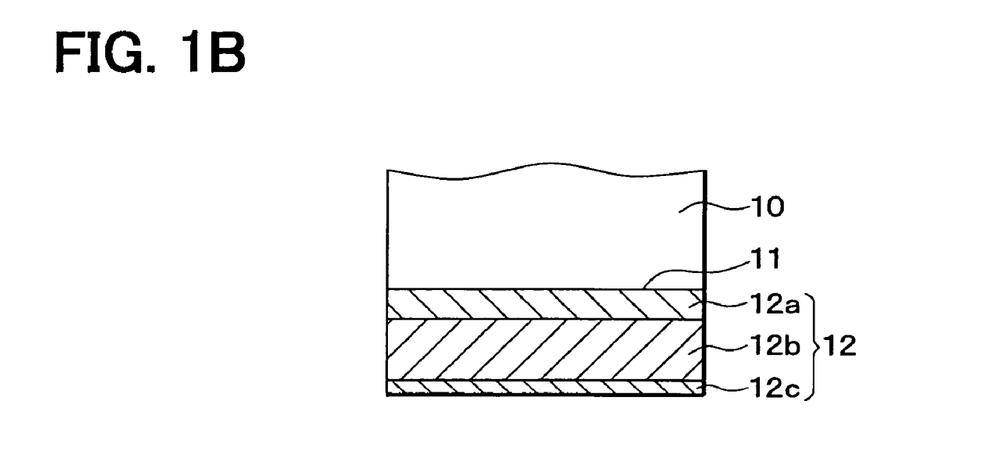
FIG. 1B is a partially enlarged cross sectional view showing an electrode of the device, according to the first embodiment.

A semiconductor device 100 according to a first embodiment of the present invention is shown in FIG. 1A. FIG. 1B is a partially enlarged cross sectional view showing a part of an electrode 12 of a semiconductor chip 10 before the chip is soldered on a base 20.

The semiconductor chip 10 is, for example, a power device. The chip is manufactured as follows. A semiconductor part such as a transistor is formed on a wafer made of a semiconductor such as a silicon wafer by using a semiconductor process. Then, the wafer is cut into multiple chips so that the semiconductor chip 10 is formed. The electrode 12 is formed on the mounting surface 11 of the chip 10.

As shown in FIG. 1B, the electrode 12 before soldering includes a titanium layer (i.e., Ti layer) 12a, a nickel layer (i.e., Ni layer) 12b, and a gold layer (i.e., Au layer), which are assembled on the mounting surface 11 in this order. These layers 12a-12c are formed by a sputtering method. Here, the Ni layer 12b in three layers 12a-12c of the electrode 12 works as a soldering layer. The Ti layer 12a is used for securing adhesiveness between the chip 10 and the Ni layer 12b. The Au layer 12c protects the Ti layer 12b as the soldering layer from oxidation. For example, the thickness of the Ti layer 12a is 250 nm, the thickness of the Ni layer 12b is 600 nm, and the thickness of the Au layer 12c is 50 nm.

The chip 10 is soldered on the base 20 through a solder layer 30 in such a manner that the electrode 12 of the chip 10, i.e., the mounting surface side of the chip 10 faces the base 20. Thus, the chip is electrically, thermally and mechanically bonded to the base 20. The base 20 is, for example, a heat sink, a lead frame or a wiring board.

The solder layer 30 preferably includes a tin, the amount of which is equal to or larger than 60%. However, the solder layer 30 can be made of other materials. Specifically, the solder layer 30 is made of, for example, Sn—Ag alloy, Sn—Ag—Cu alloy, Sn—Cu alloy, or Sn—Cu—Ni alloy. Further, the solder layer 30 can be made of Pb free solder, the amount of tin in which is equal to or larger than 95%.

Figure 2A:
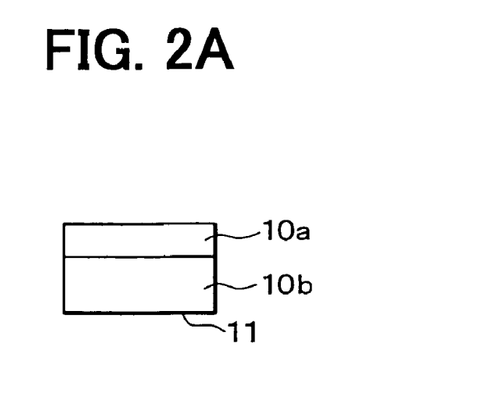
FIGS. 2A to 2F are cross sectional views explaining the method of manufacturing the device according to the first embodiment.

The semiconductor device 100 is manufactured as follows with reference to FIGS. 2A to 2F. In this embodiment, the method provides reduction of the absorbed material on the mounting surface 11 of the chip 10. Here, in FIGS. 2A to 2E, a semiconductor wafer 10b is shown. The wafer 10b is cut into multiple chips 10 afterwards. Firstly, as shown in FIG. 2A, an electric part 10a such as a transistor is formed on a principal surface of the wafer 10b by using a conventional semiconductor process. The principal surface is opposite to the mounting surface 11 of the wafer 10b.

Figure 2B:
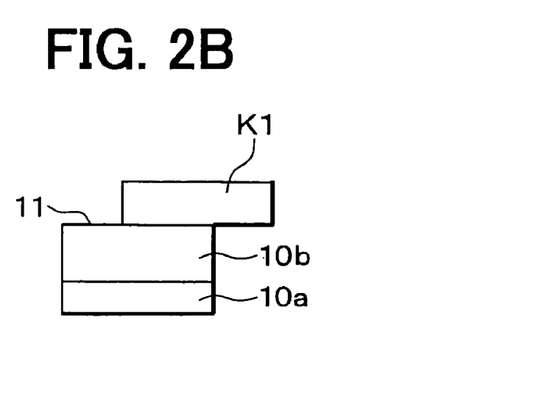
Figure 2C:
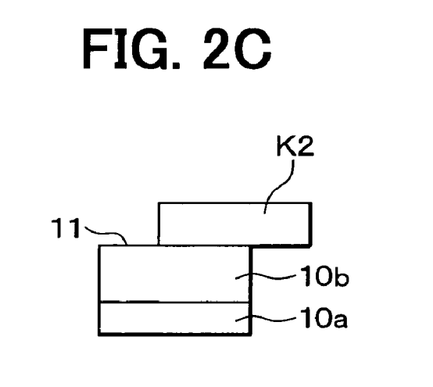

Then, the bottom of the wafer 10b, i.e., the mounting surface 11 of the wafer 10b is grinded. As shown in FIG. 2B, a grinder K1 is used for grinding so that the thickness of the wafer 10b becomes equal to or smaller than 250 μm. At this time, the first grinder K1 has the abrasive grain size No. 325, which is defined in JIS R-6001 of Japanese Standards Association. Then, as shown in FIG. 2C, the second grinder K2 having the abrasive grain size No. 2000 is used for grinding. The grain size of the second grinder K2 is smaller than that of the first grinder K1. Thus, the mounting surface 11 of the wafer 10b is finished by using the small grain size grinder K2 so that a damage layer on the mounting surface 11 caused by the first grinder K1 is removed. The damage layer includes a fault and/or a crack caused by grinding with the first grinder K1.

Figure 2D:
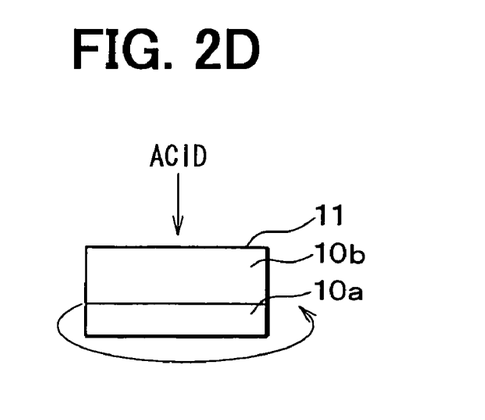

After the mounting surface 11 is grinded mechanically, the mounting surface 11 is further etched so that the mounting surface 11 becomes more smooth. Specifically, the mounting surface changes from a roughly grinded surface to a smooth surface. For example, as shown in FIG. 2D, the mounting surface 11 is etched by a wet etching method with mixed acid. Thus, the mounting surface 11 becomes a mirror-finished surface. The mixed acid can be composed of any material as long as the mixed acid is capable of etching the wafer 10b such as silicon wafer. In FIG. 2D, a spin etching method is shown. In the spin etching method, the wafer 10b is rotated, and the mixed acid is dropped on the wafer 10b from the upper side of the wafer 10b.

The mixed acid is, for example, $HNO_3$—$HF$—$H_2SO_4$ (i.e., a mixed acid of nitric acid, hydrofluoric acid and sulfuric acid) or $HNO_3$—$HF$—$H_2SO_4$—$H_3PO_4$ (i.e., a mixed acid of nitric acid, hydrofluoric acid, sulfuric acid and phosphoric acid). These mixed acids can control a surface roughness of an etched surface by changing a component or a composition of the mixed acid.

After an etching process, the mounting surface 11 becomes smooth. The surface roughness of the mounting surface 11 is measured by an atomic force microscope. Thus, an average roughness of the mounting surface 11 is equal to or smaller than 2 nm. Here, the grinded surface grinded by the grinder K2 has an average roughness equal to or smaller than 25 nm measured by the atomic force microscope. By measuring with a step height measuring device, the average roughness of the same grinded surface is equal to or smaller than 10 nm (i.e., $Ra \leq 10$ nm). It is considered that the difference between them may be caused by a difference of a top diameter of a probe between the atomic force microscope and the step height measuring device.

Figure 2E:
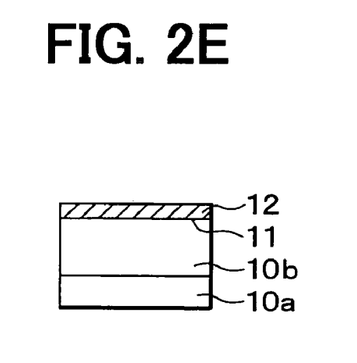

Then, as shown in FIG. 2E, the electrode 12 including the Ni layer 12b is formed on the mounting surface 11. Specifically, the Ti layer 12a having the thickness of 250 nm is firstly formed on the mounting surface 11 of the wafer 10b by using deposition equipment such as sputtering equipment. Then, the Ni layer 12b having the thickness of 600 nm and the Au layer 12c having the thickness of 50 nm are formed in this order on the Ti layer 12a.

Figure 2F:
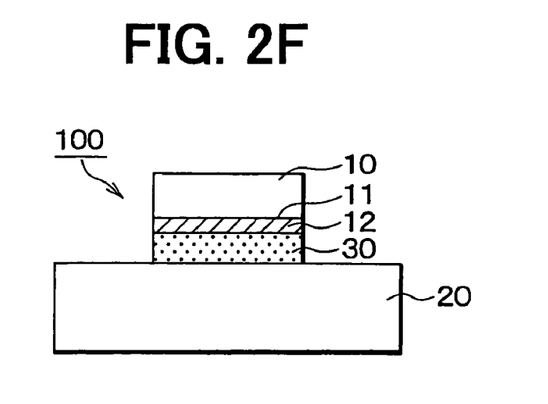

After that, the wafer 10b is cut into multiple chips 10. Thus, the semiconductor chip 10 is formed. Then, the chip 10 is mounted on the base 20 through the solder layer 30 as a solder pellet. The solder pellet is made of, for example, a solder foil. The solder pellet is heated above the solidus temperature of the solder pellet so that the solder pellet is reflowed. This reflow process is performed in reduction atmosphere such as in a hydrogen gas. Thus, the chip 10 is bonded and soldered to the base 20, so that the semiconductor device 100 is completed.

At this time, the solder pellet composing the solder layer 30 is made of, for example, Sn—Ag series solder, Sn—Ag—Cu series solder, Sn—Cu series solder, or Sn—Cu—Ni series solder, which are the Pb free solder. In the first embodiment, the solder pellet is made of 96.5% tin and 3.5% silver. The solder pellet is heated above 220° C., which is the solidus temperature of the solder pellet. The solder pellet is heated in a hydrogen reduction atmosphere furnace, and then, the solder pellet is heated above the solidus temperature of the solder during three minutes and more. Specifically, the maximum temperature of the solder pellet is set to be equal to or higher than 290° C. Thus, the solder pellet is reflowed so that the solder layer 30 is formed.

Figure 3:
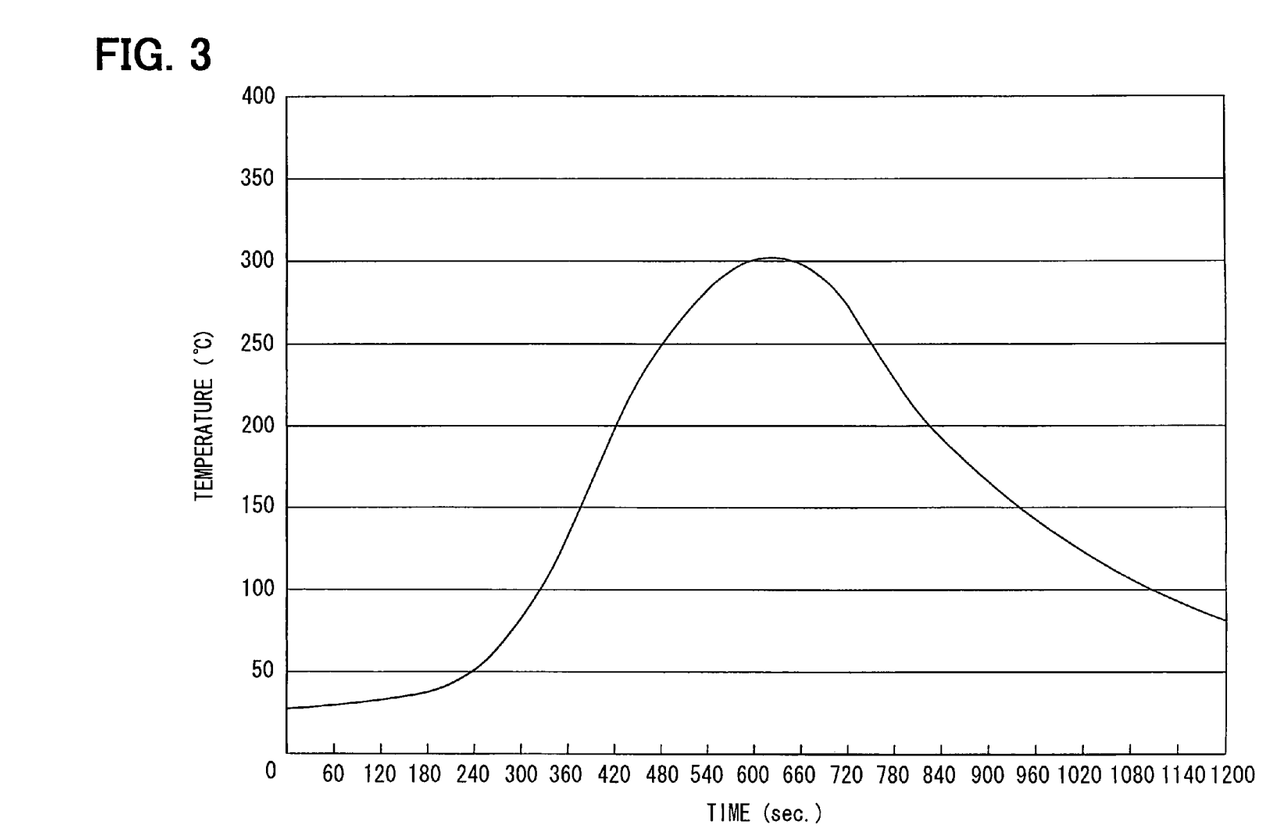
FIG. 3 is a graph showing a temperature profile in a soldering process in the method according to the first embodiment.

FIG. 3 shows a temperature profile in the solder reflow process with using the solder made of 96.5% tin and 3.5% silver. A horizontal axis of FIG. 3 represents an elapsed time, and a vertical axis represents a temperature. In this case, the maximum temperature of the process is about 300° C.

Figure 4:
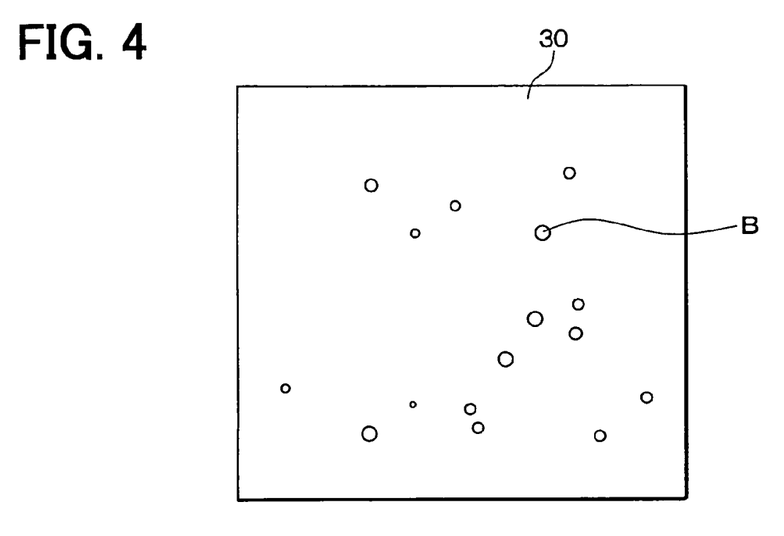
FIG. 4 is an image of X-ray transmission spectroscopy showing a solder layer in the device according to the first embodiment.

The above method for soldering provides the device 100 having small amount of voids B in the solder layer 30. Specifically, FIG. 4 shows a cross section of the solder layer 30 in the device 100 manufactured by the above method. The cross section of the solder layer 30 is observed by a X-ray transmission spectroscopy. The voids B in the solder layer 30 are reduced.

Next, the reduction of the voids B in the solder layer 30 is explained as follows.

Figure 5A:
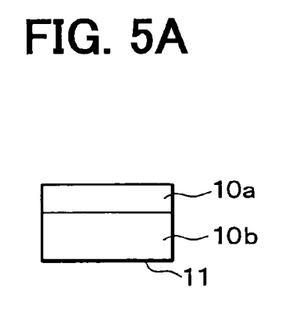
FIGS. 5A to 5D are cross sectional views explaining a first comparison method for manufacturing the device according to a first comparison of the first embodiment.
Figure 5B:
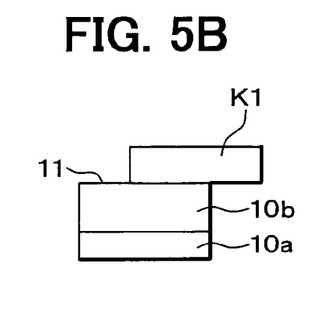

FIGS. 5A to 5D shows a first comparison method for manufacturing the semiconductor device 100. Firstly, the electric part 10a is formed on the principal surface of the wafer 10b. Then, as shown in FIG. 5B, the bottom of the wafer 10b, i.e., the mounting surface 11 of the wafer 10b is grinded by using the grinder K1 having the abrasive grain size No. 325. After grinding, the wafer 10b is washed with water to clean the mounting surface 11. Specifically, a silicon dust generated in the grinding process is removed from the mounting surface 11. Here, the grinder K1 is composed of an abrasive grain and a resin body. The abrasive grain is mounted on the resin body.

Figure 5C:
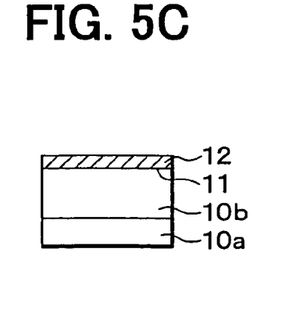
Figure 5D:
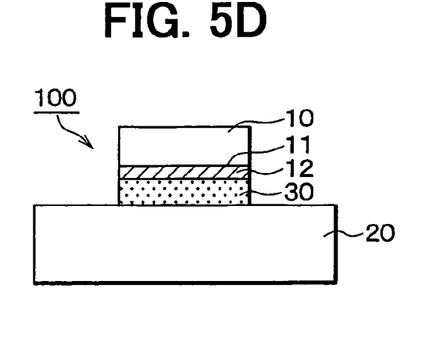

As shown in FIG. 5C, the electrode 12 including the Ni layer 12b is formed on the mounting surface 11. Specifically, the Ti layer 12a having the thickness of 250 nm, the Ni layer 12b having the thickness of 600 nm, and the Au layer 12c having the thickness of 50 nm are formed on the mounting surface 11 of the wafer 10b by a sputtering method and the like. Then, the wafer 10b is cut into multiple chips 10. Then, the chip 10 is mounted on the base 20 through a solder pellet composing the solder layer 30. Specifically, the solder pellet is inserted between the electrode 12 of the chip 10 and the base 20. The solder pellet is heated in the reduction atmosphere such as in a hydrogen gas so that the temperature becomes higher than the solidus temperature of the solder pellet. Thus, the solder pellet is reflowed so that the chip 10 is soldered and bonded to the base 20.

In the above comparison method, the solder pellet is made of 96.5% of tin and 3.5% of silver. The solder pellet is heated up to a temperature equal to or higher than 220° C., which is the solidus temperature of the solder pellet. The temperature profile of the reflow process in the comparison method is the same as the method according to the first embodiment shown in FIG. 3.

A second comparison method for manufacturing the semiconductor device 100 is provided by using a conventional Pb solder pellet composing the solder layer 30. The Pb solder pellet is made of 10% of tin and 90% of lead. The second comparison method is almost the same as the first comparison method shown in FIGS. 5A to 5D, except for the maximum reflow temperature of 350° C.

FIG. 6A shows the solder layer 30 manufactured by the first comparison method, and FIG. 6B shows the solder layer 30 manufactured by the second comparison method. Specifically, FIGS. 6A and 6B are obtained by a X-ray transmission spectroscopy. As shown in FIG. 6B, in the solder layer 30 composed of Pb solder made of 10% of tin and 90% of lead, the voids B in the solder layer 30 is comparatively a little. However, as shown in FIG. 6A, in the solder layer 30 composed of Pb free solder made of 96.5% of tin and 3.5% of silver, the voids B in the solder layer 30 is comparatively large. Here, the tin component in the solder layer 30 composed of Pb solder made of 10% of tin and 90% of lead is small, compared with the tin component in the solder layer 30 composed of Pb free solder made of 96.5% of tin and 3.5% of silver. Tin easily alloys with nickel. Since the tin component in the solder layer 30 composed of Pb free solder made of 96.5% of tin and 3.5% of silver is comparatively large, many voids B are formed in the solder layer 30.

Figure 7:
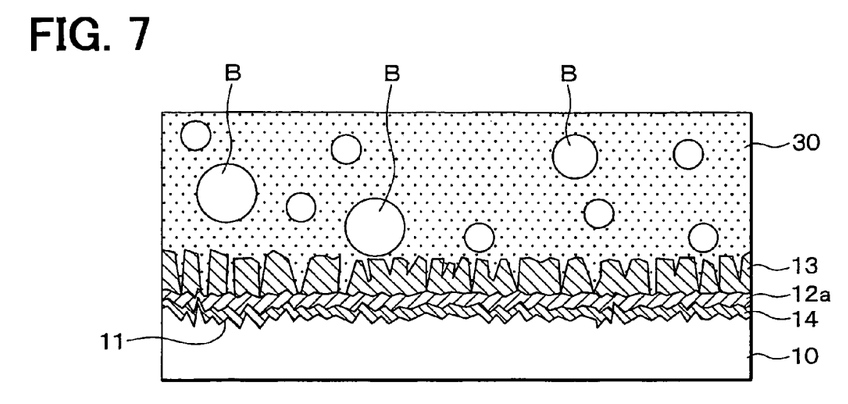
FIG. 7 is a cross sectional view explaining a void generation mechanism in the first comparison method for manufacturing the device according to the first comparison of the first embodiment.

The above mechanism is estimated as follows. FIG. 7 is a cross sectional view showing the solder layer 30 composed of Pb free solder made of 96.5% of tin and 3.5% of silver. The solder layer 30 shown in FIG. 7 is manufactured by the first comparison method shown in FIGS. 5A to 5D. Specifically, the solder pellet is heated up to 300° C. Since the tin component in the solder layer 30 composed of Pb free solder made of 96.5% of tin and 3.5% of silver is comparatively large, the Ni layer 12b as the electrode for soldering alloys with tin so that a Ni—Sn alloy layer 13 as a nickel and tin alloy layer is formed. Thus, the thickness of the Ni layer 12b becomes thinner. Further, the Ni layer 12b may disappear. In this case, a void generation source 14 on the mounting surface 11 of the chip 10 generates the gas, and then, the gas diffuses into the solder layer 30 easily. This is because the Ni layer 12b disappears so that the Ni layer does not work as a protection layer, which prevents the gas from diffusing into the solder layer 30.

Here, although the Ti layer 12a is disposed after soldering, the Ti layer 12a is comparatively thin and a porous film so that the gas easily transmits through the Ti layer 12a. Thus, the gas generated from the void generation source 14 diffuses into the solder layer 30. Thus, it is considered that the solder layer 30 composed of Pb free solder made of 96.5% of tin and 3.5% of silver manufactured by the first comparison method includes many voids B. The gas generated from the void generation source 14 is composed of water, $CO_2$ gas, hydrocarbon gas and the like. This composition of the gas is measured by a TG-MS analysis (i.e., thermogravimetric mass spectroscope analysis) method.

Figure 8A:
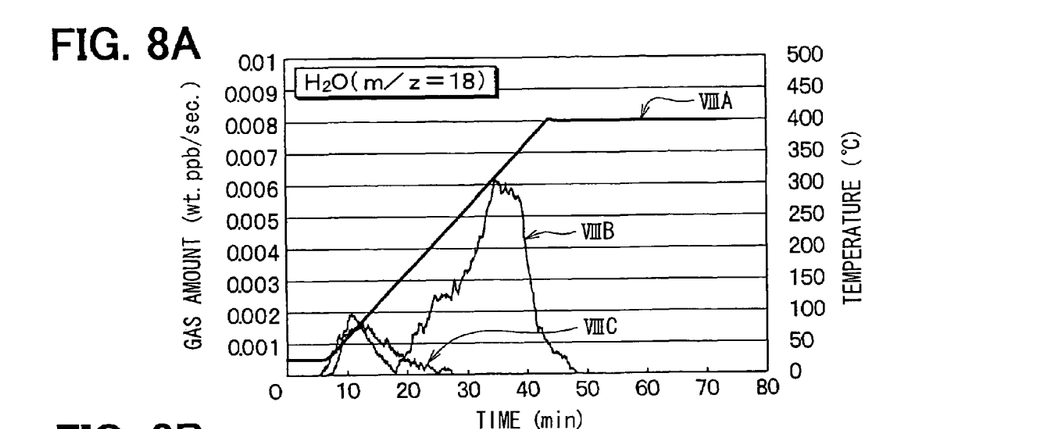
FIGS. 8A to 8C are graphs explaining results of a TG-MS analysis, according to the first embodiment.
Figure 8B:
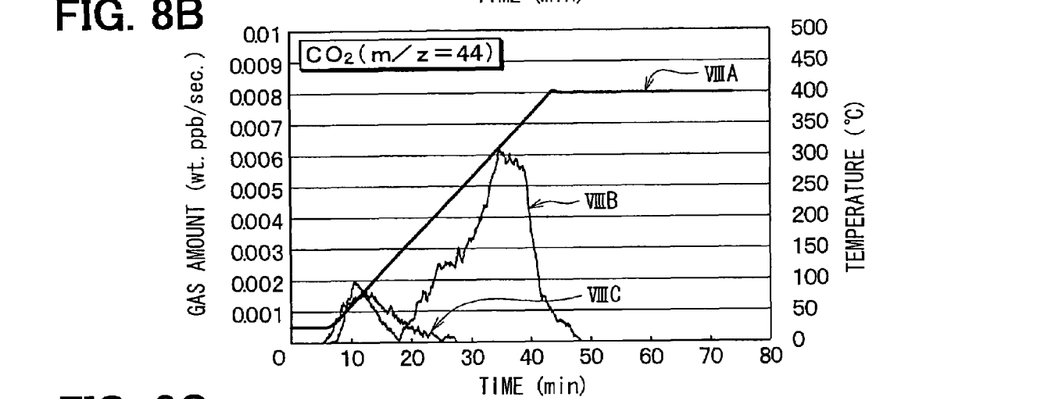
Figure 8C:
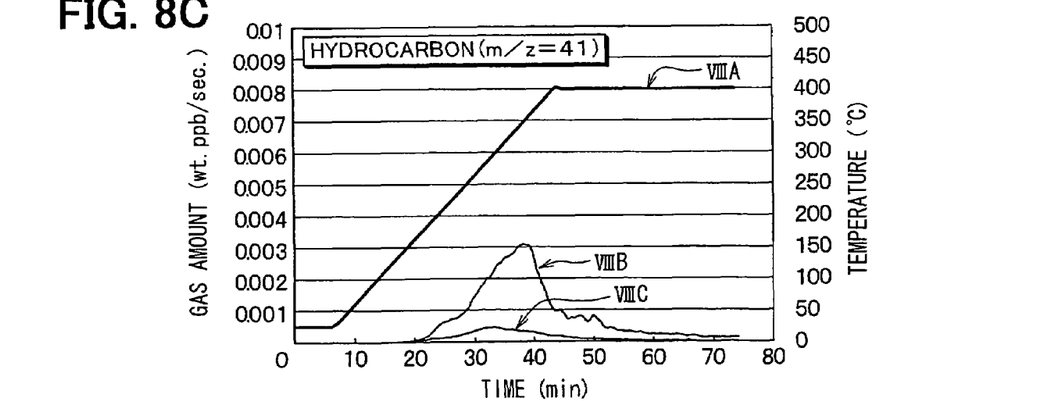

FIGS. 8A to 8C show results of the TG-MS analysis. Specifically, FIGS. 8A to 8C show a temperature profile of a relationship between temperature and elapsed time and further show a relationship between a gas generation rate and the elapsed time. FIG. 8A shows the gas generation rate of the water, i.e., moisture in the solder layer 30. FIG. 8B shows the gas generation rate of the $CO_2$ gas. FIG. 8C shows the gas generation rate of the hydrocarbon gas. The horizontal axis in each drawing represents the elapsed time in min., and the vertical axis represents the temperature in ° C. and the gas generation rate in weight ppb per sec. VIIIA in each drawing represents the temperature profile, VIIIB represents the gas generation rate in the solder layer 30 manufactured by the first comparison method, and VIIIC represents the gas generation rate in the solder layer 30 manufactured by the method according to the first embodiment.

As shown in FIGS. 8A to 8C, when the temperature is equal to or higher than 300° C., the water, the $CO_2$ gas and the hydrocarbon gas are largely generated and removed from the solder layer 30 in a case where the solder layer is manufactured by the first comparison method. The water is derived from a water washing process after grinding. The $CO_2$ gas and the hydrocarbon gas are derived from the resin in the grinders K1, K2 in the grinding process. However, when the solder layer 30 is manufactured by the method according to the first embodiment, the method in which the mounting surface 11 is mirror-finished so that the mounting surface 11 becomes smooth, the removal amounts of the water the $CO_2$ gas, and the hydrocarbon are much reduced even when the temperature is equal to or higher than 300° C.

Figure 9:
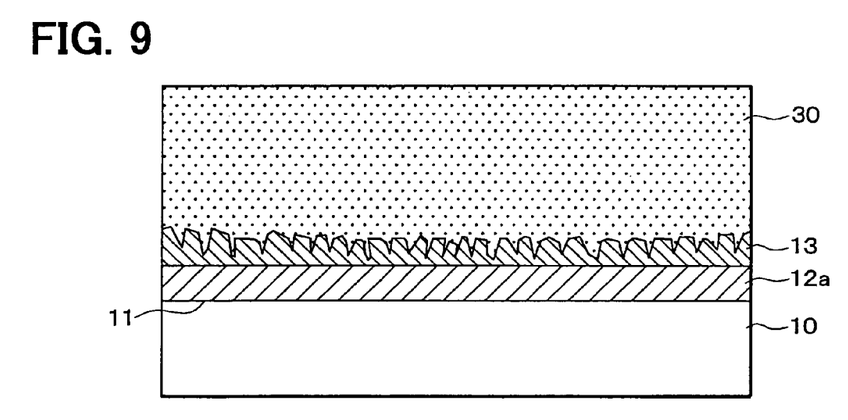
FIG. 9 is a cross sectional view explaining a void reduction mechanism in the method for manufacturing the device according to the first embodiment.

A mechanism of reduction of the voids B according to the first embodiment is explained as follows. FIG. 9 shows the solder layer 30 manufactured by the method shown in FIGS. 2A to 2F. Specifically, the solder pellet is heated up to 300° C. In this case, the solder pellet is made of the Pb free solder having the tin composition equal to or higher than 60%. Therefore, the tin composition in the solder layer 30 is comparatively large. Therefore, after the solder reflow process, the Ni layer 12b as the electrode for soldering alloys with tin so that the Ni—Sn alloy layer 13 is formed. Thus, the Ni layer 12b disappears.

However, the mounting surface 11 of the chip 10 becomes smooth compared with the mounting surface shown in 7. Therefore, the surface area of the mounting surface 11 becomes smaller. Thus, the void generation source 14 for generating the water, the $CO_2$ gas and the hydrocarbon gas is not easily absorbed on the mounting surface 11. Thus, the amount of the void generation source 14 absorbed on the mounting surface 11 is much reduced.

Further, since the Ti layer 12a is formed on the smooth surface, i.e., the mounting surface 11, the Ti layer 12a is formed to be high density so that the Ti layer 12a may prevent the gas from penetrating into the solder layer 30. Specifically, the film quality of the Ti layer 12a becomes high so that the density of the film in the Ti layer 12a becomes higher.

Thus, the method according to the first embodiment provides the solder layer 30 having a small amount of the voids B therein. Preferably, the solder layer 30 includes the amount of tin equal to or higher than 60%. This is because the method is much effective when the solder layer 30 includes the amount of tin equal to or higher than 60%. Further, the maximum temperature of the solder layer in the solder reflow process is equal to or higher than 290° C. When the solder layer 30 includes the amount of tin equal to or higher than 60%, the solidus temperature of the solder is about 220° C. Therefore, when the maximum temperature of the solder layer in the solder reflow process is equal to or higher than 290° C., the solder pellet is effectively reflowed so that the solder layer 30 is appropriately formed. Although the mounting surface 11 is etched by the wet etching method after grinding, the mounting surface 11 can be etched by a dry-etching method.

Second Embodiment

A method for manufacturing the semiconductor device 100 having the solder layer 30 according to a second embodiment is provided. In the second embodiment, the gas generated from the void generation source 14 on the mounting surface 11 of the semiconductor chip 10 is prevented from penetrating into the solder layer 30 through the electrode 12.

In the first embodiment, since the mounting surface 11 becomes smooth, the anchor effect of the electrode 12 is reduced so that the electrode 12 may be removed from the device 100. In this case, it is considered that the Ni layer 12b as a protection film for preventing the gas from penetrating into the solder layer 30 remains after the solder reflow process. The method according to the second embodiment provides the solder layer 30 having the Ni layer 12b so that the Ni layer 12b does not disappear.

The method is explained as follows. Firstly, the electric part 10a is formed on the principal surface of the wafer 10b. Then, the mounting surface 11 of the wafer 10b is grinded. Specifically, the grinder K1 is used for grinding so that the thickness of the wafer 10b becomes equal to or smaller than 250 μm. At this time, the first grinder K1 has the abrasive grain size No. 325. Then, the second grinder K2 having the abrasive grain size No. 2000 is used for grinding. Thus, the mounting surface 11 of the wafer 10b is finished by using the small grain size grinder K2 so that a damage layer on the mounting surface 11 caused by the first grinder K1 is removed.

After the mounting surface 11 is grinded mechanically, the mounting surface 11 is further etched so that the mounting surface 11 becomes more smoothly. Specifically, the mounting surface 11 is etched by a wet etching method with mixed acid. Thus, the mounting surface 11 becomes a mirror-finished surface. The mixed acid is different from that shown in FIG. 2D.

After an etching process, the mounting surface 11 becomes smooth. The average roughness Ra of the mounting surface 11 is about 235 nm. Here, the average roughness of the mounting surface 11 is measured by the step height measuring device. This surface roughness is larger than that shown in FIG. 2D. Thus, the mounting surface 11 has appropriate surface roughness, which is appropriately roughened.

The mixed acid is, for example, $HNO_3$—HF—$H_2SO_4$ (i.e., a mixed acid of nitric acid, hydrofluoric acid and sulfuric acid) or $HNO_3$—HF—$H_2SO_4$—$H_3PO_4$. These mixed acids can control a surface roughness of an etched surface by changing a component or a composition of the mixed acid.

Here, although the mounting surface 11 is firstly grinded by the grinder K1, the mounting surface 11 can be firstly grinded by the second grinder K2 so that the step of grinding with the first grinder K1 is skipped. Further, although the mounting surface 11 is etched by the wet etching method, the mounting surface 11 can be etched by the dry-etching method.

After the above process, the electrode 12 is formed on the mounting surface 11 having the surface roughness of 235 nm. In this case, the thickness of the Ni layer 12b is equal to or larger than 800 nm. Preferably, the thickness of the Ni layer 12b is equal to or larger than 1000 nm. In this case, the Ni layer 12b surely remains after soldering.

Although the mounting surface 11 is grinded and etched, the electrode 12 including the Ni layer 12b can be formed on the mounting surface 11 after the mounting surface 11 is grinded by the first grinder K1. Specifically, the steps of grinding with the second grinder K2 and etching with the mixed acid are skipped.

Then, the wafer 10b is cut into multiple chips 10. Then, the chip 10 is mounted on the base 20 through the solder pellet.

At this time, the solder pellet composing the solder layer 30 is made of 96.5% tin and 3.5% silver. The solder pellet is heated above the solidus temperature of the solder pellet. The solder pellet is heated in the hydrogen reduction atmosphere furnace, and then, the solder pellet is heated above the solidus temperature of the solder during three minutes and more. Specifically, the maximum temperature of the solder pellet is set to be equal to or higher than 290° C. Thus, the solder pellet is reflowed so that the solder layer 30 is formed. Specifically, the temperature profile in the solder reflow process is shown in FIG. 3. The maximum temperature of the process is about 300° C.

In the second embodiment, the Ni layer 12b remains after soldering. Specifically, the soldering conditions in the solder reflow process are determined to remain the Ni layer 12b between the chip 10 and the solder layer 30. Thus, the Ni layer 12b exists between the chip 10 and the base 20. In this case, the amount of the voids B in the solder layer 30 is much reduced. This is observed by the X-ray transmission spectroscopy.

Figure 10:
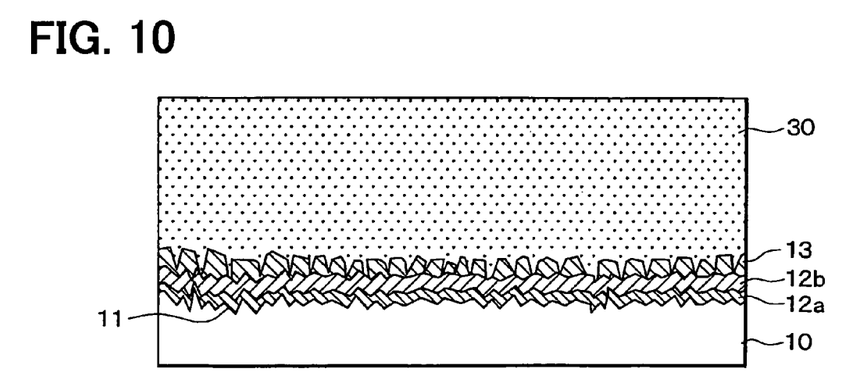
FIG. 10 is a cross sectional view explaining a void reduction mechanism in a method for manufacturing a semiconductor device according to a second embodiment of the present invention.

A mechanism of reduction of the voids B according to the second embodiment is explained as follows. FIG. 10 shows the solder layer 30 manufacture by the method according to the second embodiment.

FIG. 10 shows the solder layer 30 and the electrode 12 on the chip 10. The solder layer 30 is made of 96.5% of tin and 3.5% of silver, and the maximum temperature in the solder reflow process is 300° C. The surface roughness of the mounting surface 11 is about 235 nm. The thickness of the Ni layer 12b is 1000 nm. The Ni—Sn alloy layer 13 is formed in the solder layer 30 so that the thickness of the Ni layer 12b is reduced. However, since the initial thickness of the Ni layer 12b is sufficiently large, the Ni layer 12b remains between the solder layer 30 and the chip 10 even when a part of the Ni layer 12b alloys with tin. Thus, the remained Ni layer 12b prevents the gas from penetrating into the solder layer 30. Therefore, the gas does not diffuse in the solder layer 30. Thus, the voids B are not generated in the solder layer 30 substantially.

In the second embodiment, the mounting surface 11 of the chip 10 has appropriate surface roughness so that the adhesiveness of the electrode 12 is improved. Further, the voids B in the solder layer 30 is reduced.

When the thickness of the Ni layer 12b is 600 nm, the amount of the voids B in the solder layer 30 is almost the same as that shown in FIG. 6A. When the thickness of the Ni layer 12b is 800 nm or 1000 nm, the amount of the voids B in the solder layer 30 is much reduced. Therefore, when the initial thickness of the Ni layer 12b is sufficiently large, the Ni layer 12b remains after soldering.

In the second embodiment, the maximum temperature in the solder reflow process can be set equal to or higher than 290° C. Even when the maximum temperature is high, the gas is prevented from penetrating into the solder layer 30 so that the voids B are not formed in the solder layer 30.

Third Embodiment

A method for manufacturing the semiconductor device 100 having the solder layer 30 according to a third embodiment is provided. In the third embodiment, the solder reflow temperature is reduced so that the gas is not generated from the void generation source 14 on the mounting surface 11 of the semiconductor chip 10.

When the thickness of the Ni layer 12b becomes thicker, the electrode 12 may be removed from the device 100 by a stress in the Ni layer 12b. Here, as shown in FIGS. 8A to 8C, the gas such as the water, the $CO_2$ gas and the hydrocarbon gas absorbed on the mounting surface 11 is easily generated when the temperature is increased to be equal to or higher than 300° C. It is considered that the gas is not generated from the source 14 when the solder reflow temperature in the solder reflow process is low.

The method according to the third embodiment is explained as follows.

Firstly, the electric part 10a is formed on the principal surface of the wafer 10b. Then, the mounting surface 11 of the wafer 10b is grinded. Specifically, the grinder K1 having the abrasive grain size No. 325 is used for grinding so that the thickness of the wafer 10b becomes equal to or smaller than 250 μm. Then, the second grinder K2 having the abrasive grain size No. 2000 is used for grinding. After the mounting surface 11 is grinded mechanically, the mounting surface 11 is further etched so that the mounting surface 11 becomes smooth. Specifically, the mounting surface 11 is etched by a wet etching method with mixed acid. Thus, the mounting surface 11 becomes a mirror-finished surface. The mixed acid is different from that shown in FIG. 2D. Thus, the mounting surface 11 has appropriate surface roughness, which is appropriately roughened.

After an etching process, the mounting surface 11 becomes smooth. The average roughness Ra of the mounting surface 11 is almost the same as that shown in FIG. 9. Then, the electrode 12 is formed on the mounting surface 11. In this case, the thickness of the Ni layer 12b is 600 nm.

Although the mounting surface 11 is grinded and etched, the electrode 12 including the Ni layer 12b can be formed on the mounting surface 11 after the mounting surface 11 is grinded by the first grinder K1. Specifically, the steps of grinding with the second grinder K2 and etching with the mixed acid can be skipped.

Then, the wafer 10b is cut into multiple chips 10. Then, the chip 10 is mounted on the base 20 through the solder pellet.

At this time, the solder pellet composing the solder layer 30 is made of 96.5% tin and 3.5% silver. The solder pellet is heated above the solidus temperature of the solder pellet. The solder pellet is heated in the hydrogen reduction atmosphere furnace, and then, the solder pellet is heated above the solidus temperature of the solder during three minutes and more. Specifically, the maximum temperature of the solder pellet is set to be equal to or lower than 300° C. Thus, the solder pellet is reflowed so that the solder layer 30 is formed. Specifically, the temperature profile in the solder reflow process is shown in FIG. 3. The maximum temperature of the process is about 300° C.

In the third embodiment, the maximum temperature is set to be equal to or lower than 300° C., at which the reduction atmosphere is managed to maintain. Preferably, the maximum temperature is equal to or lower than 290° C. More preferably, the maximum temperature is in a range between 250° C. and 300° C. Furthermore preferably, the maximum temperature is in a range between 260° C. and 280° C. Thus, the chip 10 is soldered and bonded to the base 20.

As described above, the gas is easily generated when the temperature is higher than 300° C. However, in the third embodiment, the maximum temperature is equal to or lower than 300° C. Therefore, even when the mounting surface 11 is appropriately roughened, the gas is prevented from generating form the source 14. Thus, the voids B in the solder layer 30 are reduced.

Figure 11:
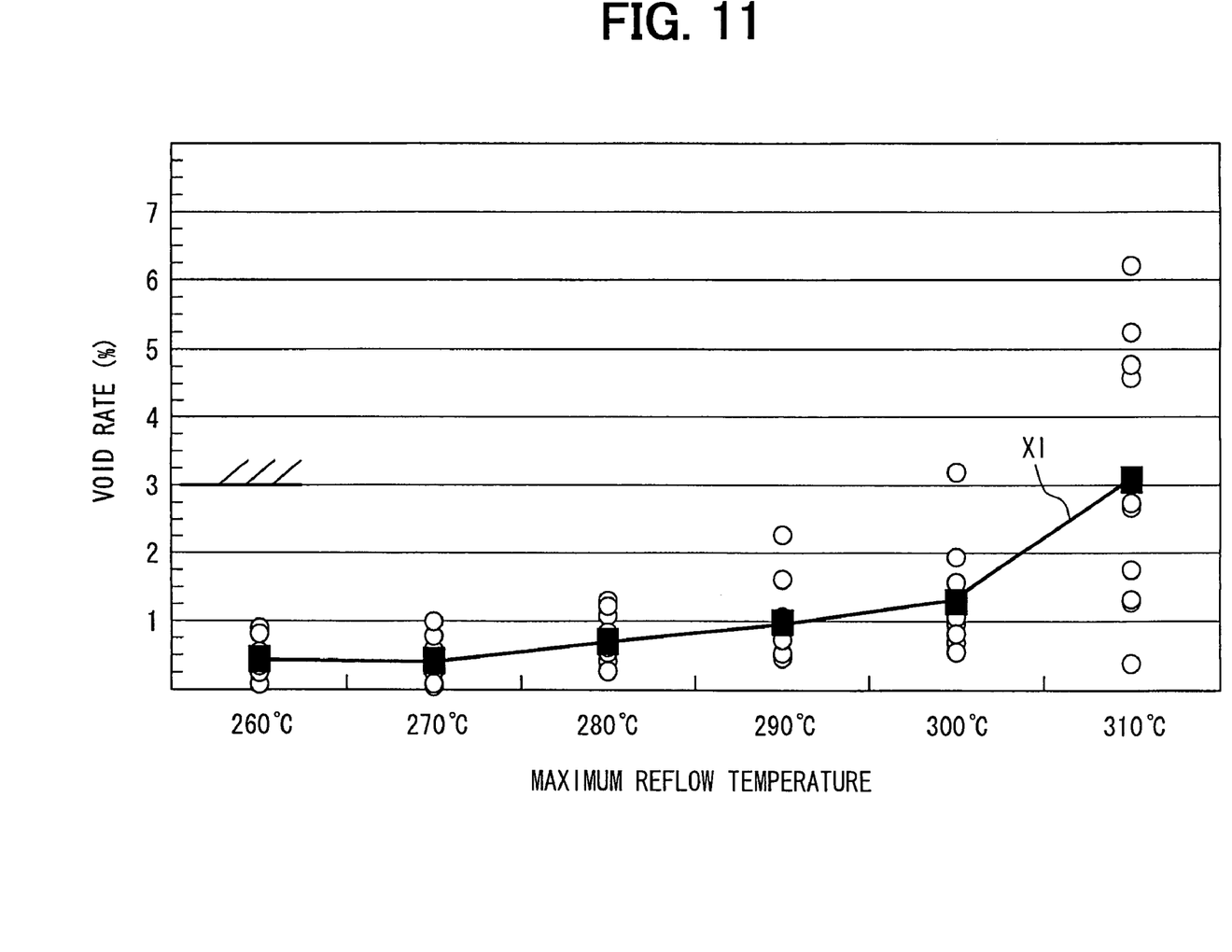
FIG. 11 is a graph showing a relationship between the maximum reflow temperature and a void rate of a solder layer in a semiconductor device manufacture by a method according to a third embodiment of the present invention.

FIG. 11 is a graph showing a relationship between the maximum reflow temperature and a void rate. The reflow temperature represents the maximum temperature in the temperature profile in the solder reflow process. The void rate is estimated from the result obtained by the X-ray transmission spectroscopy. Specifically, the void rate is defined as a ratio between the area of the voids B and the area of the mounting surface 11. Here, when the void rate is equal to or smaller than 3%, the solder layer 10 shows excellent performance. In FIG. 11, the average void rate is shown as a curve XI. A circle represents individual measurement result of the void rate.

When the maximum reflow temperature is equal to or lower than 300° C., the average void rate is equal to or lower than 3%. Further, when the maximum reflow temperature is equal to or lower than 290° C., the individual void rate is equal to or lower than 3%.

Thus, the voids B in the solder layer 30 is effectively reduced. In the third embodiment, the thickness of the initial Ni layer 12b before soldering is equal to or thinner than 800 nm. Specifically, the thickness of the Ni layer 12b can be 600 nm. Even when the thickness of the initial Ni layer 12b before soldering is equal to or thinner than 800 nm, the voids B is prevented from forming in the solder layer 30 since the maximum temperature is equal to or lower than 300° C.

(Modifications)

Although the solder pellet is heated in the reduction atmosphere, the solder pellet can be heated in other atmosphere as long as the solder pellet is not oxidized. For example, the solder pellet can be heated in an inert gas atmosphere such as in nitrogen gas.

Although the solder pellet is used, other material can be used. For example, the solder layer 30 can be formed of a solder paste. In this case, the solder paste is preliminarily applied to the chip 10. Further, the solder paste can be applied to the base 20, and then, the chip 10 is mounted on the base 20 through the solder paste. The solder paste is made of the Pb free solder such as Sn—Ag series solder, Sn—Cu series solder, and Sn—Cu—Ni series solder.

Although the Ni layer 12b is used in the electrode 12, other layer can be used in the electrode 12. For example, Cu layer, Pd layer, Pt layer or Ag layer can be used as the electrode for soldering.

Such changes and modifications are to be understood as being within the scope of the present invention as defined by the appended claims.

What is claimed is:

1. A method for manufacturing a semiconductor device having a solder layer, the method comprising the steps of:
   grinding a mounting surface of a semiconductor chip;
   etching the mounting surface of the chip; and after the etching, the mounting surface having an average surface roughness equal to or smaller than 2 nm;
   forming an electrode on the mounting surface of the chip, wherein the step of forming the electrode includes directly bonding the electrode to the mounting surface of the semiconductor chip;
   assembling the chip, the solder layer and a base in this order; and
   heating the chip, the solder layer and the base to be equal to or higher than a solidus temperature of the solder layer so that the solder layer is reflowed for soldering the chip on the base, wherein
   the solder layer includes tin in an amount equal to or larger than 95% of the solder layer and is formed from Sn—Ag, Sn—Ag—Cu, Sn—Cu, or Sn—Cu—Ni, and of a Pb free solder, and
   the step of forming the electrode includes the step of forming a nickel layer having a thickness equal to or larger than 600 nm on the mounting surface.

2. The method according to claim 1, wherein
   in the step of assembling, the electrode on the mounting surface of the chip faces the base through the solder layer.

3. The method according to claim 1, wherein the step of etching the mounting surface is performed after the step of grinding the mounting surface so that the mounting surface becomes a smooth surface.

4. The method according to claim 1, wherein
   in the step of heating, a maximum temperature is equal to or less than 290° C.

5. The method according to claim 1, wherein
   the step of etching the mounting surface is performed after the step of grinding the mounting surface so that the mounting surface becomes a mirror finished surface.

6. The method according to claim 1, wherein
   the solder layer is formed from a solder pellet.

7. The method according to claim 1, wherein
   the solder layer is formed from a solder paste.

8. The method according to claim 1, wherein
   after the step of grinding, the mounting surface has an average surface roughness equal to or smaller than 25 nm.

9. The method according to claim 1, wherein
   the surface roughness of the mounting surface is set to be equal to or smaller than 2 nm to reduce a void generation source, which generates voids in the solder layer, on the mounting surface.

10. The method according to claim 1, wherein the step of forming the electrode includes the step of forming a layer substantially comprising nickel above the mounting surface, and the nickel layer has a thickness in a range of 600 nm to 1000 nm so that the nickel layer maintains a predetermined adhesiveness and prevents gas from penetrating the solder layer.

11. The method according to claim 1, wherein the step of forming the electrode further includes the steps of:

forming a titanium layer on the mounting surface; and forming a gold layer on the nickel layer so that the titanium layer, the nickel layer and the gold layer are respectively stacked on the mounting surface.

12. The method according to claim 1, wherein the step of forming a nickel layer having a thickness equal to or larger than 600 nm on the mounting surface comprises forming the nickel layer as a void protection layer having a sufficient thickness to prevent the nickel layer from disappearing during the step of heating the chip, the solder layer and the base.

* * * * *